US012671056B2

(12) United States Patent
    Aida et al.

(10) Patent No.: US 12,671,056 B2
(45) Date of Patent: Jun. 30, 2026

(54) ION MILLING DEVICE

(71) Applicant: Hitachi High-Tech Corporation, Tokyo (JP)

(72) Inventors: Shota Aida, Tokyo (JP); Hisayuki Takasu, Tokyo (JP); Atsushi Kamino, Tokyo (JP); Hitoshi Kamoshida, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 316 days.

(21) Appl. No.: 18/273,325

(22) PCT Filed: Jan. 22, 2021

(86) PCT No.: PCT/JP2021/002163
    § 371 (c)(1),
    (2) Date: Jul. 20, 2023

(87) PCT Pub. No.: WO2022/157908
    PCT Pub. Date: Jul. 28, 2022

(65) Prior Publication Data
    US 2024/0120174 A1     Apr. 11, 2024

(51) Int. Cl.
    *H01J 37/305*     (2006.01)
    *H01J 37/08*      (2006.01)
    *H01J 37/24*      (2006.01)

(52) U.S. Cl.
    CPC .......... *H01J 37/3056* (2013.01); *H01J 37/08* (2013.01); *H01J 37/243* (2013.01)

(58) Field of Classification Search
    CPC ...... H01J 37/3056; H01J 37/08; H01J 37/243; H01J 37/3053; H01J 37/304; H01J 37/20
    See application file for complete search history.

(56) References Cited

U.S. PATENT DOCUMENTS

2007/0045228 A1     3/2007     Kubota et al.
2013/0240353 A1     9/2013     Watanabe et al.
                    (Continued)

FOREIGN PATENT DOCUMENTS

CN     103210467 A     7/2013
JP     63-55535 U      4/1988
                (Continued)

OTHER PUBLICATIONS

International Search Report (PCT/ISA/210) issued in PCT Application No. PCT/JP2021/002163 dated Apr. 20, 2021 with English translation (6 pages).
                (Continued)

*Primary Examiner* — David E Smith
(74) *Attorney, Agent, or Firm* — Crowell & Moring LLP

(57)     ABSTRACT

In order to improve the processing reproducibility, an ion milling device 100 includes a sample chamber 107, a sample stage 102 that is disposed in the sample chamber on which a sample is placed, an ion source 101 that emits an unfocused ion beam toward the sample, a control unit 112 that controls an output of the ion beam, an oscillator 104 that is disposed in the sample chamber, and an oscillation circuit 111 that oscillates the oscillator and outputs an oscillation signal to the control unit, in which the control unit controls the output of the ion beam such that a vibrational frequency change amount of the oscillator per unit time due to deposition of sputtered particles generated by irradiating the sample with the ion beam on the oscillator is kept within a predetermined range.

15 Claims, 6 Drawing Sheets

(56)         References Cited

U.S. PATENT DOCUMENTS

| 2017/0221677 | A1 | * | 8/2017 | Asai | H01J 37/3053 |
| 2017/0263511 | A1 | | 9/2017 | Tedeschi | |
| 2018/0204705 | A1 | | 7/2018 | Tomimatsu et al. | |
| 2021/0287871 | A1 | | 9/2021 | Asai et al. | |

FOREIGN PATENT DOCUMENTS

| JP | 11-160057 | A | | 6/1999 | |
| JP | 2006344745 | A | * | 12/2006 | H01J 37/3053 |
| JP | 2007-48588 | A | | 2/2007 | |
| JP | 2019-510374 | A | | 4/2019 | |
| JP | 2019137877 | A | * | 8/2019 | |
| KR | 10-2123887 | B1 | | 6/2020 | |
| TW | 201840963 | A | | 11/2018 | |

OTHER PUBLICATIONS

Japanese-language Written Opinion (PCT/ISA/237) issued in PCT Application No. PCT/JP2021/002163 dated Apr. 20, 2021 (5 pages).

Chinese-language Office Action issued in Taiwanese Application No. 111101962 dated Dec. 23, 2022 (6 pages).

Korean-language Office Action issued in Korean Application No. 10-2023-7022950 dated Dec. 15, 2024 with English translation (14 pages).

* cited by examiner

[FIG. 1]
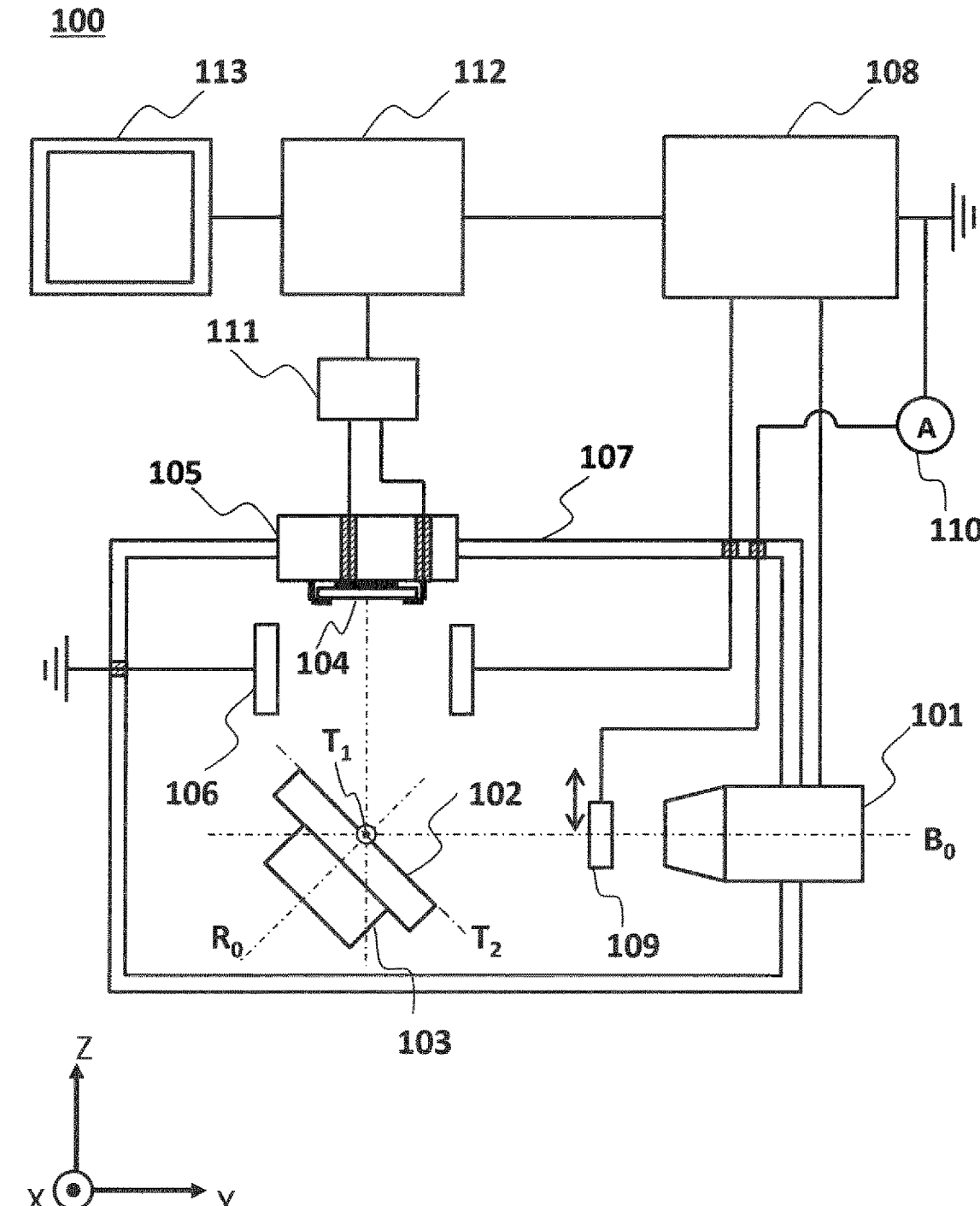

[FIG. 2]
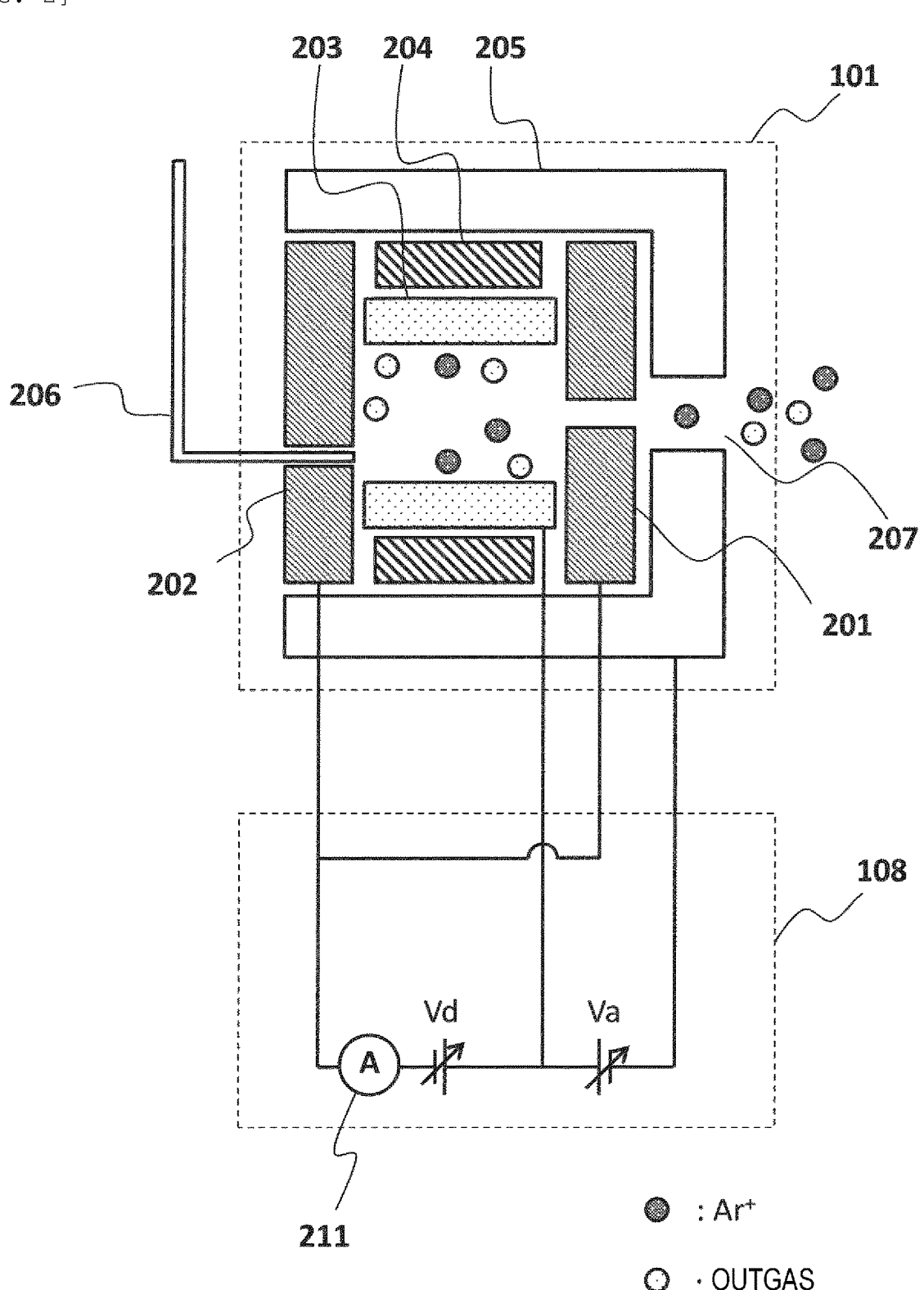

[FIG. 3]
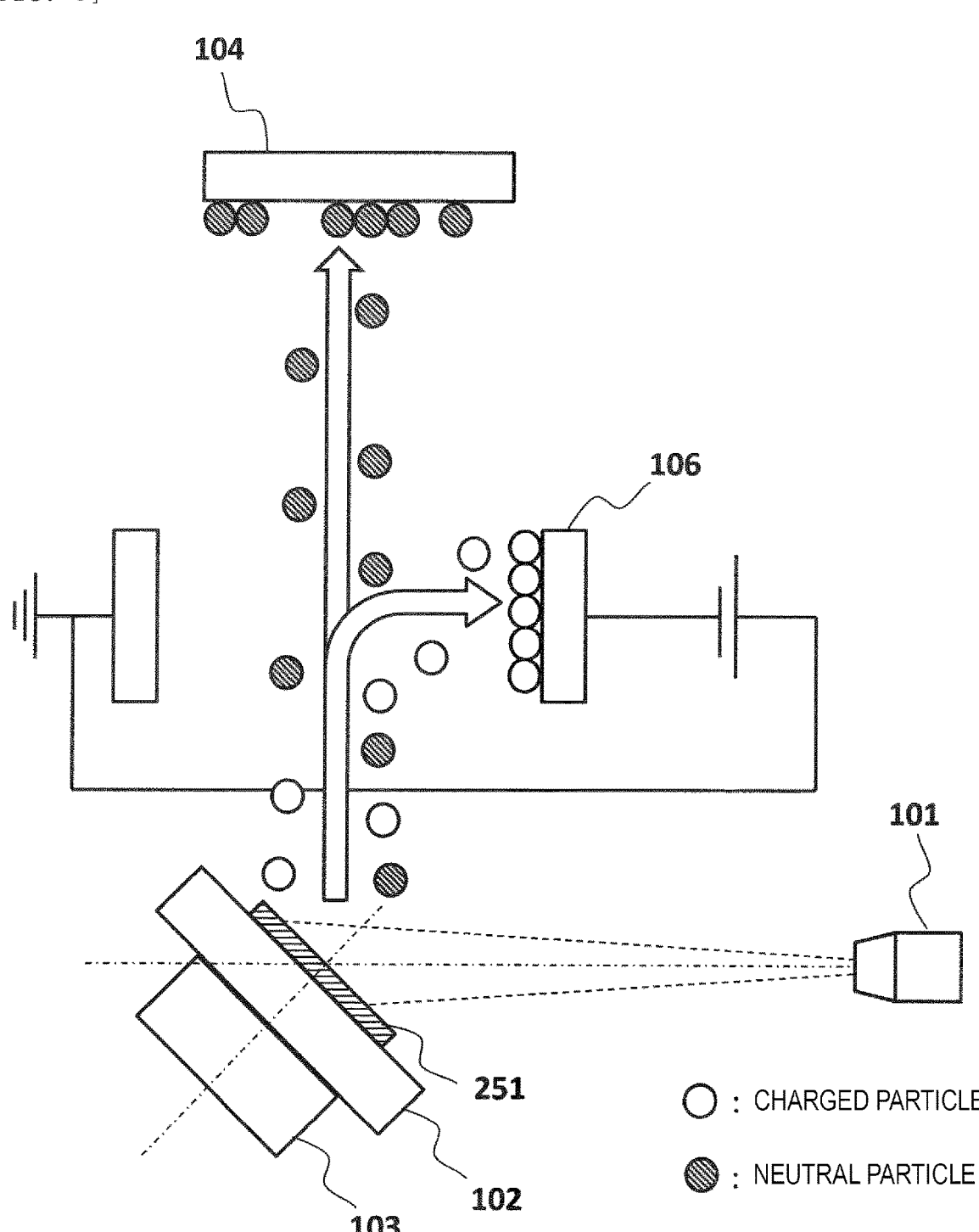

[FIG. 4]
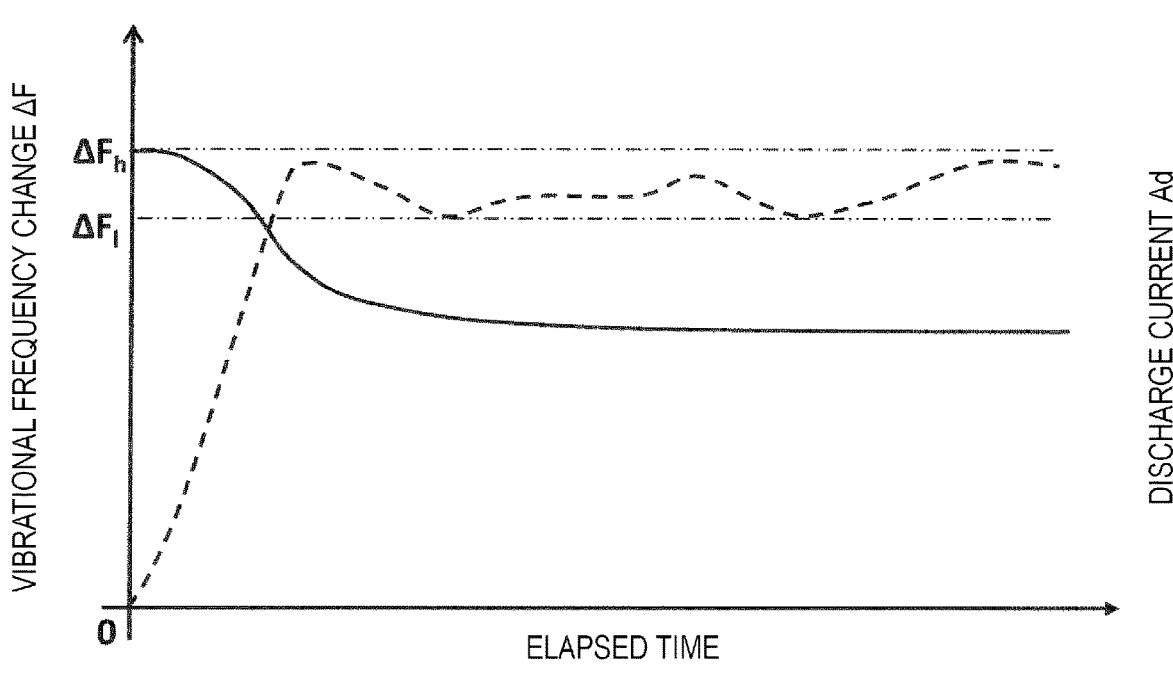
———————  :  DISCHARGE CURRENT
--------------  :  VIBRATIONAL FREQUENCY CHANGE
[FIG. 5A]
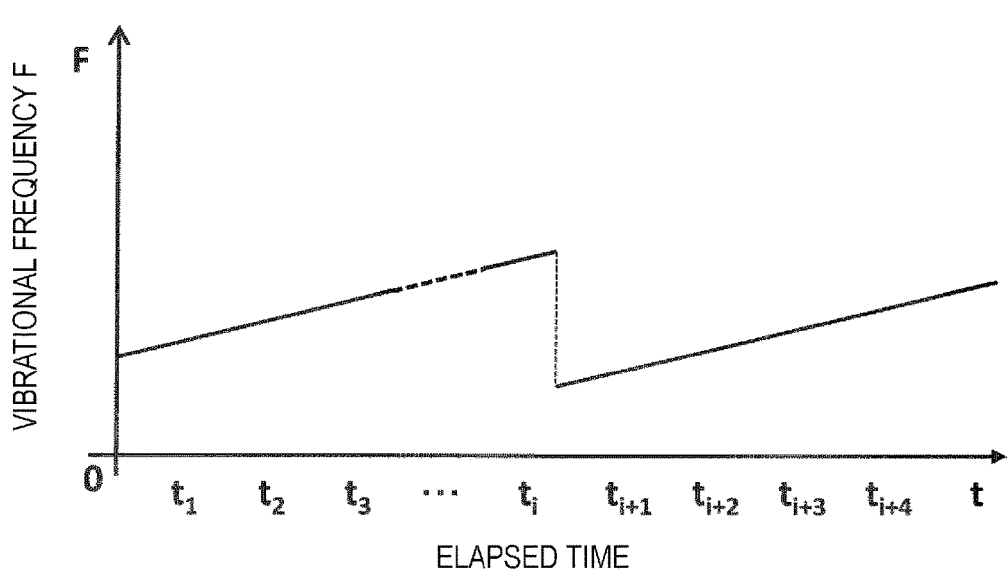

[FIG. 5B]
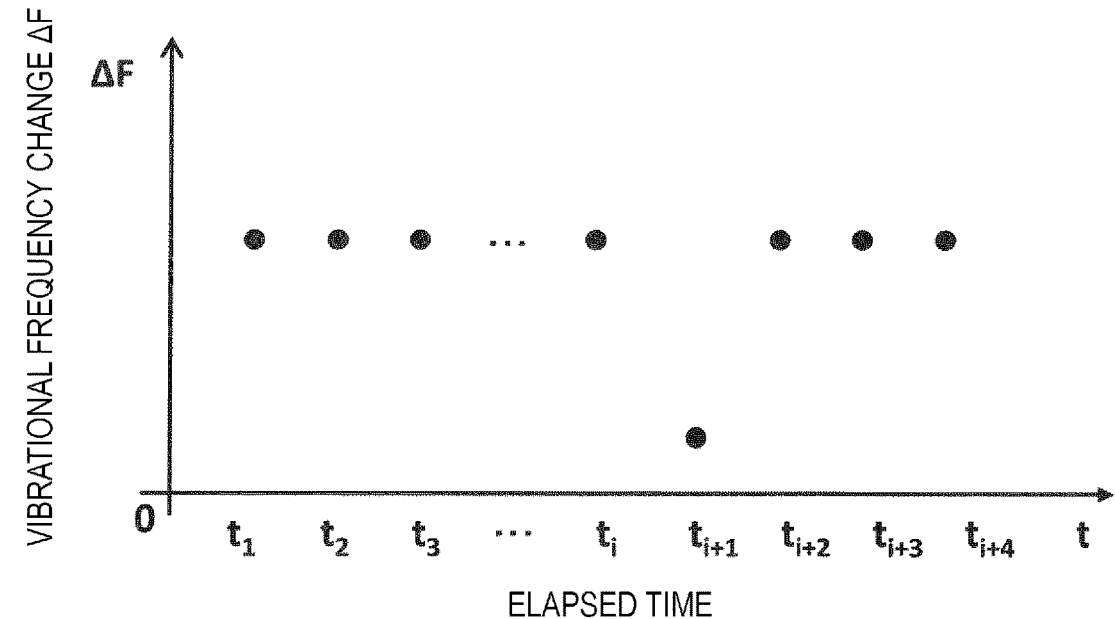

[FIG. 6]
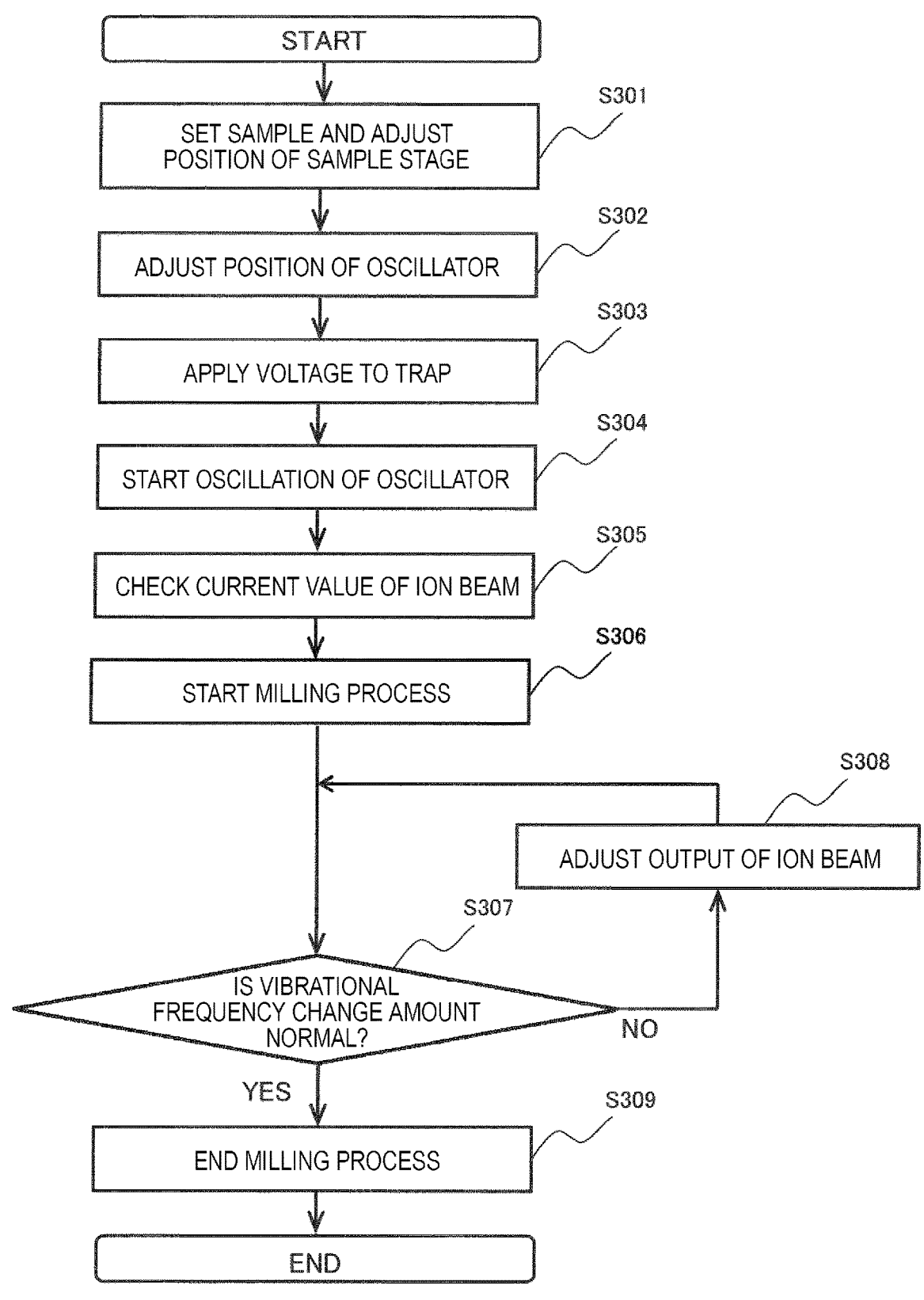

ION MILLING DEVICE

TECHNICAL FIELD

The present invention relates to an ion milling device.

BACKGROUND ART

An ion milling device is used to irradiate a sample (e.g., a metal, a semiconductor, a glass, a ceramic, and the like) to be observed by an electron microscope with an unfocused ion beam and sputter the atoms on a sample surface without stress by the sputtering phenomenon, thereby polishing the sample surface and exposing an internal structure of the sample. The polished sample surface and exposed internal structure of the sample by the irradiation with the ion beam are observed with a scanning electron microscope or a transmission electron microscope.

PTL 1 discloses an ion beam etching apparatus (ion milling device), in which an etching amount measuring device measures an etching amount of an object (sample) to be processed and detects an etching end point. The etching amount measuring device includes a member to be processed, which is different from the object (sample) to be processed, and the member to be processed is etched by the irradiation with a part of the ion beams. The etching amount measuring device measures a mass of a substance generated by etching the member to be processed and obtains in advance relational expression between the mass of the measured substance and the etching amount of the object (sample) to be processed, so as to calculate the etching amount of the object (sample) to be processed in real time. Here, the use of an oscillator such as a crystal oscillator is exemplified in order to measure the mass of the substance generated by etching the member to be processed. Specifically, the mass of the deposited substance is measured by utilizing the fact that the resonance frequency of the oscillator changes according to the thickness of a layer deposited on the oscillator.

CITATION LIST

Patent Literature

PTL 1: JP2006-344745A

SUMMARY OF INVENTION

Technical Problem

Control parameters for the ion beam include an amount of argon gas introduced into an ion source, a discharge voltage applied to the ion source, an acceleration voltage, or the like. Since a discharge current value of the ion source, an ion beam current value, or an ion beam distribution changes according to these control values, in the related art, users adjust the control parameter values empirically based on those measured values.

When a process of polishing the surface of an electron microscope sample or exposing an internal structure of the sample is performed by an ion milling device, uniformity of a processed shape of the sample may be required. In order to improve the uniformity of the processed shape by the ion milling device, simply equalizing the etching amount is insufficient, and it is necessary to control the energy and distribution of the ion beams to be always kept within a certain range during a milling process.

Meanwhile, even when the control parameters are set so as to obtain the desired discharge current value, ion beam current value or ion beam distribution, in the case of venting (release to the atmosphere) for the replacement of the sample, outgas originating from the atmosphere may be adsorbed onto an internal electrode of the ion source, the adsorbed outgas may be ionized together with the argon gas, and the internal electrode may be consumed, thus resulting in variations in an ion beam output during the milling process. When such variations in the output of the ion beam occur during the milling process, the uniformity of the processed shape of the sample cannot be ensured.

As described above, PTL 1 discloses an etching amount measuring device that monitors the etching amount by the ion beam in real time. However, in the case of the unfocused ion beam, the intensity of a central region used for processing the sample and the intensity of a peripheral region not used for processing the sample are significantly different from each other. In PTL 1, since the etching amount in the central region of the ion beam is estimated from the etching amount in the peripheral region of the ion beam, there is a concern that variations occurring in the central region of the ion beam actually used for processing the sample may not be fully reflected. Furthermore, a part of the layer deposited on the oscillator may fall during the milling process. In PTL 1, since the mass of the deposited substance is measured from the change in the resonance frequency before and after processing, when a part of the deposit falls during the milling process, correct measurement cannot be performed.

Solution to Problem

An ion milling device according to an embodiment of the present invention includes a sample chamber, a sample stage that is disposed in the sample chamber and on which a sample is placed, an ion source that emits an unfocused ion beam toward the sample, a control unit that controls an output of the ion beam, an oscillator that is disposed in the sample chamber, and an oscillation circuit that oscillates the oscillator and outputs an oscillation signal to the control unit, in which the control unit controls the output of the ion beam such that a vibrational frequency change amount of the oscillator per unit time due to deposition of sputtered particles generated by irradiating the sample with the ion beam on the oscillator is kept within a predetermined range.

Advantageous Effects of Invention

An ion milling device that stabilizes the output of ion beams and improves processing reproducibility is provided.

Other issues and novel features will become apparent from the description of the present specification and the accompanying drawings.

BRIEF DESCRIPTION OF DRAWINGS

FIG. 1 is a schematic diagram showing a configuration of an ion milling device.

FIG. 2 is a schematic diagram showing an ion source and a power supply circuit that applies a control voltage to the ion source.

FIG. 3 is a schematic diagram showing a process of depositing sputtered particles on an oscillator.

FIG. 4 shows measurement results (a schematic diagram) of a vibrational frequency change of the oscillator and a discharge current of the ion source during a milling process.

FIG. 5A is a schematic diagram showing a vibrational frequency of the oscillator during the milling process.

FIG. 5B is a schematic diagram showing a vibrational frequency change of the oscillator during the milling process.

FIG. 6 is a flowchart of sample processing by the ion milling device.

DESCRIPTION OF EMBODIMENTS

Preferred embodiments of the present invention will be described below with reference to the drawings.

FIG. 1 is a schematic diagram showing a main part of an ion milling device 100 according to an embodiment of the present invention as viewed from a side. In FIG. 1, the vertical direction is indicated as a Z direction. The ion milling device 100 includes, as the main components, an ion source 101, a sample stage 102, a sample stage drive source 103, an oscillator 104, an oscillator position adjustment mechanism 105, a trap 106, a sample chamber 107, a power supply unit 108, a beam current detection conductor 109, an ammeter 110, an oscillation circuit 111, a control unit 112, and a display unit 113.

The ion milling device 100 is used as a pretreatment device for observing a surface or cross section of a sample with a scanning electron microscope or a transmission electron microscope. An ion source for such a pretreatment device often employs a Penning method which is effective for miniaturizing the structure. The ion source 101 in this embodiment also employs the Penning method. The sample fixed to the sample stage 102 is irradiated with an unfocused ion beam from the ion source 101.

The sample stage 102 with the sample placed thereon is attached to the sample chamber 107 via the sample stage drive source 103. The sample stage drive source 103 rotates the sample stage 102 around a rotation axis $R_0$. Further, the sample stage drive source 103 is attached to the sample chamber 107 such that a position of the sample stage 102 can be adjusted in each of X, Y and Z directions, and an orientation of the sample stage 102 with respect to an ion beam central axis $B_0$ can be adjusted in each of an angular direction of an XZ plane (rotational direction about the $T_1$ axis) and an angular direction of a YZ plane (rotational direction about the $T_2$ axis).

The oscillator 104 is installed near the sample stage 102. As the oscillator 104, a disk-shaped crystal oscillator may be used, for example. The oscillator 104 is attached to the sample chamber 107 by the oscillator position adjustment mechanism 105. The oscillator position adjustment mechanism 105 can adjust a position of the oscillator 104 in each of the X, Y and Z directions, and adjust an orientation of the oscillator 104 in each of the angular direction of the XZ plane and the angular direction of the YZ plane. Although it will be described below that the oscillator position adjustment mechanism 105 makes the oscillator 104 movable to improve the sensitivity of monitoring the ion beam, the oscillator 104 may be fixed to the sample chamber 107 without providing the oscillator position adjustment mechanism 105, or the structure of the oscillator position adjustment mechanism 105 may be simplified by limiting the directions in which the position and orientation of the oscillator 104 of the oscillator position adjustment mechanism 105 can be adjusted.

The oscillator 104 is connected to the oscillation circuit 111 through electrodes provided in the oscillator position adjustment mechanism 105. The oscillation circuit 111 oscillates the oscillator 104 and outputs an oscillation signal to the control unit 112. Sputtered particles generated by irradiating the sample placed on the sample stage 102 with the ion beam adhere to the oscillator 104 and increase the mass of the oscillator 104, thereby changing a vibrational frequency of the oscillator 104. Specifically, the vibrational frequency of the oscillator 104 decreases with respect to the initial vibrational frequency. The amount of sputtered particles generated when an abnormality occurs during the milling process, such as a decrease of an ion beam current value of the ion beam emitted from the ion source 101 or a shift of the irradiation position of the ion beam onto the sample, is different from the amount of sputtered particles generated when the milling process is performed without such an abnormality.

As described above, the vibrational frequency of the oscillator 104 decreases as the sputtered particles derived from the sample adhere to the oscillator 104. In this case, focusing on a vibrational frequency change of the oscillator 104 per unit time, when an output of the ion beam is stable as a desired output, by reflecting the fact that an amount of sputtering per unit time is constant, the vibrational frequency change per unit time also exhibits a substantially constant value, but when there is any variation in the output of the ion beam, the amount of sputtering per unit time varies, and the vibrational frequency change per unit time also varies. Therefore, in this embodiment, the control unit 112 monitors the vibrational frequency change of the oscillator 104 per unit time so as to monitor the occurrence of an abnormality in the ion milling process.

As described above, since the vibrational frequency change of the oscillator 104 per unit time varies according to the rate of increase of the mass of the sputtered particles adhering to the oscillator 104, in this embodiment, the oscillator position adjustment mechanism 105 is configured such that the oscillator 104 can be disposed at an appropriate position. Specifically, by adjusting the distance from the sample using the oscillator position adjustment mechanism 105, the change in the vibrational frequency of the oscillator 104 can be adjusted to an appropriate magnitude regardless of the change in the amount of sputtering on the sample that varies according to the irradiation energy of the ion beam. Furthermore, the orientation of the oscillator 104 can be adjusted according to the setting of the irradiation angle of the ion beam onto the sample.

Further, according to the size and number of compositions of the sample subjected to the milling process, a plurality of combinations of the oscillator 104 and the oscillation circuit 111 for monitoring may be provided.

The trap 106 is provided near the oscillator 104. Although details will be described below, the trap 106 traps charged particles of the sputtered particles, and only neutral particles of the sputtered particles adhere to the oscillator 104.

The movable beam current detection conductor 109 is provided near an ion beam irradiation port of the ion source 101. When the ion beam is emitted from the ion source 101 and the beam current detection conductor 109 is disposed on the ion beam central axis $B_0$, the beam current detection conductor 109 serves as a shutter for blocking the irradiation with the ion beam onto the sample, and also an ion beam current amount of the ion beam with which the beam current detection conductor 109 is irradiated can be measured by the ammeter 110. The ion beam current amount measured by the ammeter 110 is transmitted to the control unit 112 and used to control the ion source 101. In addition, the measured ion beam current amount is displayed on the display unit 113. When the beam current detection conductor 109 is moved to a position away from the ion beam central axis $B_0$, the sample is irradiated with the ion beam from the ion source 101.

The power supply unit 108 is configured to include a power supply circuit that generates a voltage to be applied to an internal electrode of the ion source 101 and a power supply circuit that generates a voltage to be applied to the trap 106. In this embodiment, for example, by controlling the voltage to be applied to the internal electrode of the ion source 101 with the power supply unit 108 according to the state of the ion beam monitored by the vibrational frequency of the oscillator 104, the control unit 112 can adjust the output of the ion beam such that the milling amount per fixed time is stabilized.

It is required that the sample chamber 107 be kept in a vacuum state during the milling process. For this reason, the signal wiring and power wiring for connecting the components disposed in the sample chamber 107 and the control circuit, the power supply circuit, or the like disposed outside the sample chamber 107 are connected via a hermetic connector in order to maintain vacuum of the sample chamber 107.

FIG. 2 is a schematic diagram showing the ion source 101 employing the Penning method and a power supply circuit for applying a control voltage to the internal electrode of the ion source 101. The power supply circuit is a part of the power supply unit 108.

The ion source 101 includes a first cathode 201, a second cathode 202, an anode 203, a permanent magnet 204, an acceleration electrode 205, a gas pipe 206, and an ion beam irradiation port 207. Argon gas is injected into the ion source 101 through the gas pipe 206 to generate the ion beam. The first cathode 201 and the second cathode 202 having the same potential are disposed inside the ion source 101, and the anode 203 is disposed between the first cathode 201 and the second cathode 202. A discharge voltage Vd from the power supply unit 108 is applied between the cathodes 201 and 202 and the anode 203 so that electrons are generated. The electrons are retained by the permanent magnet 204 disposed in the ion source 101 and collide with the argon gas injected from the gas pipe 206 so that argon ions are generated. An acceleration voltage Va from the power supply unit 108 is applied between the anode 203 and the acceleration electrode 205, and the generated argon ions are attracted to the acceleration electrode 205 and emitted as an ion beam through the ion beam irradiation port 207.

The output of the ion beam emitted from the ion source 101 depends on the state of discharge inside the ion source 101. In the ion source 101 employing the Penning method, as the irradiation with the ion beam is repeated, a discharge current value varies due to wear of the internal parts of the ion source 101, or fine particles generated from the object (sample) to be processed as a subject of irradiation may scatter and adhere to the ion beam irradiation port 207, causing the ion beam current value to vary. Further, gas (outgas) particles entrained in the air and adhering to the first cathode 201, the second cathode 202, and the anode 203 are also ionized and emitted as an ion beam together with the argon ions.

Therefore, in order to obtain high-precision reproducibility of processing, it is desirable not to use an unstable ion beam for the milling process due to factors such as discharge current or ion beam current variations and ionization of gas particles, and to monitor in real time whether the desired ion beam output is achieved, based on the vibrational frequency change of the oscillator 104.

FIG. 3 shows a schematic diagram showing a process of depositing the sputtered particles on the oscillator 104. The sputtered particles adhering to the oscillator 104 form a deposited layer on a surface of the oscillator 104. When the thickness of the deposited layer on the oscillator 104 increases, at least some of the deposited sputtered particles (herein, referred to as particle agglomerates) are likely to fall from the oscillator 104. When the particle agglomerates fall, the vibrational frequency of the oscillator 104 changes abruptly, which can easily cause monitoring errors, and when the particle agglomerates fall frequently, the oscillator 104 needs to be replaced. In particular, when continuous processing for a long time is required, it is necessary to lengthen the replacement cycle of the oscillator 104. For this reason, in this embodiment, the trap 106 that selectively traps the charged particles of the sputtered particles by an electric field is disposed near the surface of the oscillator 104 such that only the neutral particles of the sputtered particles, which are difficult to be desorbed from the deposited layer, are selectively deposited on the surface of the oscillator 104.

When a sample 251 placed on the sample stage 102 is irradiated with the ion beam from the ion source 101, the sputtered particles are generated. The sputtered particles include the neutral particles not doped with the argon ions and the charged particles doped with the argon ions. By disposing the trap 106 that forms an electric field on the path to the oscillator 104, the charged particles with a positive charge are trapped in the negative electrode of the trap 106 and only the neutral particles adhere to the oscillator 104.

FIG. 4 is a schematic diagram of measurement results of a vibrational frequency change $\Delta F$ of the oscillator 104 and a discharge current Ad of the ion source 101 when the milling process is performed on the sample. The vibrational frequency change $\Delta F$ is a vibrational frequency change amount of the oscillator 104 per unit time, and the discharge current Ad is a current measured by an ammeter 211 shown in FIG. 2. In FIG. 4, the discharge current value is represented by a solid line, and the vibrational frequency change amount is represented by a broken line. In addition, the origin of the elapsed time is set to be a point in time at which the ion beam starts to be emitted from the ion source 101.

Since the gas generated from the internal electrode of the ion source 101 is ionized together with the argon gas immediately after the start of the ion beam emission, the discharge current Ad exhibits a high value. As time passes, the number of gas particles decreases, so the discharge current Ad gradually decreases and exhibits a stable value. This is because the ion beam current amount varies according to the amount of supplied argon gas after the atmosphere-derived gas adsorbed to the internal electrode is completely desorbed from the ion gun electrode part.

As the discharge current Ad increases, the ion beam current value also increases, and accordingly, the vibrational frequency change amount increases immediately after the start of the ion beam emission, but when the discharge current Ad, and therefore the ion beam current amount, is stabilized, the vibrational frequency change $\Delta F$ of the oscillator 104 also exhibits a stable value. Therefore, by monitoring the vibrational frequency change $\Delta F$ of the oscillator 104, it is possible to monitor and control the ion beam without contacting the ion beam.

In addition, there may be cases in which the particle agglomerates fall from the deposited layer deposited on the oscillator 104, and the vibrational frequency of the oscillator 104 changes while monitoring the ion beam. In this case, the influence of falling the particle agglomerates can be suppressed by calculating the vibrational frequency change $\Delta F$ of the oscillator 104 as follows. FIG. 5A is a schematic diagram showing a vibrational frequency F of the oscillator 104 during the milling process. FIG. 5B is a schematic diagram corresponding to FIG. 5A, and showing the vibrational frequency change ΔF of the oscillator 104 during the milling process. For simplicity, the vibrational frequency change ΔF at time $t_j$ is calculated as $(F(t_j)-F(t_{j-1}))/(t_j-t_{j-1})$.

In the example of FIG. 5A, the vibrational frequency temporarily varies due to the particle agglomerates falling from the oscillator 104 between sampling time $t_i$ and sampling time $t_{i+1}$. However, when the ion beam is stable, the vibrational frequency change ΔF is stable before and after the fall. In the case of the above calculation formula, as shown in FIG. 5B, an abnormal value appears in the vibrational frequency change amount at the sampling time till, but the vibrational frequency change amount that reflects the state of the ion beam appears before and after the sampling time $t_{i+1}$. In this way, even when the particle agglomerates fall from the deposited layer of the oscillator 104, the ion beam can be controlled by not using a value of the vibrational frequency across before and after the particle agglomerates fall for the calculation of the vibrational frequency change ΔF, or by ignoring the vibrational frequency change amount calculated using the value of the vibrational frequency across before and after the particle agglomerates fall, thereby properly performing monitoring even when the particle agglomerates fall. For example, when the difference between the vibrational frequency change amount calculated at the current sampling time and the vibrational frequency change amount calculated at the previous sampling time is equal to or greater than a predetermined value, control is performed in which the vibrational frequency change amount calculated at the current sampling time is treated as an abnormal value and ignored.

FIG. 6 shows a flowchart of sample processing by the ion milling device 100.

S301: A sample is set on the sample stage 102, and the position of the sample stage 102 is adjusted. Although FIG. 1 shows an example of setting at 45 degrees with respect to the XZ plane, the position and orientation of the sample stage 102 are not limited thereto.

S302: The position of the oscillator 104 with respect to the sample stage 102 is adjusted by the oscillator position adjustment mechanism 105. When there are a plurality of oscillators 104, the position of each oscillator is adjusted.

S303 and S304: A voltage is applied to the trap 106. The oscillator 104 is oscillated by the oscillation circuit 111. In addition, it is sufficient that the voltage applied to the trap 106 and the oscillation of the oscillator 104 are stable before the start of the milling process in step S305, and the timings of steps S303 and S304 and at which the ion beam starts to be emitted from the ion source 101 may not be necessarily as those shown in the flowchart of FIG. 6.

S305: The ion beam starts to be emitted from the ion source 101. At this stage, the beam current detection conductor 109 is disposed on the ion beam central axis $B_0$ to block the irradiation with the ion beam onto the sample, and the ion beam current amount is measured by the ammeter 110. As shown in FIG. 4, the output of the ion beam immediately after the start of the ion beam emission is excessive due to the influence of the outgas. Therefore, the beam current detection conductor 109 blocks the ion beam and waits until the ion beam is stabilized.

S306: The ion beam current amount is monitored, and when it is determined that the value of the ion beam current amount is stabilized, the beam current detection conductor 109 is moved from the ion beam central axis $B_0$ to start the milling process for the sample with the ion beam. This determination may be made by the control unit 112 or may be determined by a user after displaying the ion beam current amount on the display unit 113. In addition, the discharge current amount, instead of the ion beam current amount, may be monitored. In addition, in the milling process, the control unit 112 executes control such as rotating the sample stage 102 by the sample stage drive source 103 according to the details of the process.

S307: The control unit 112 continuously monitors the vibrational frequency change ΔF of the oscillator 104 from the oscillation signal of the oscillation circuit 111 during the milling process. As shown in FIG. 4, in the milling process, the user sets a normal range (here, upper limit: $ΔF_h$, lower limit: $ΔF_l$) of the vibrational frequency change ΔF, and continuously monitors whether a value of the vibrational frequency change ΔF is within the set normal range. Since this normal range differs according to the sputtering yield of the sample and the processing conditions (the angle of the sample and the output of the ion beam set in step S301), and the like, the user determines the normal range by processing a dummy sample and the like in advance.

S308: When the vibrational frequency change ΔF of the oscillator 104 exceeds or is likely to exceed the normal range, the output of the ion beam generated from the ion source 101 is adjusted. For example, the power supply unit 108 controls the discharge voltage Vd to adjust the output of the ion beam. Alternatively, the flow rate of the argon gas may be controlled. As shown in FIG. 4, when the vibrational frequency change ΔF reaches the lower limit ΔF 1 of the normal range, the output of the ion beam is increased to control the value of the vibrational frequency change ΔF to be within the set normal range.

S309: The milling process is ended. For example, a milling process time is set as one of the processing conditions, and the milling process is ended when the set milling process time elapses from the start of the milling process (step S306).

As described above, while the invention made by the inventor has been specifically described based on the embodiments, the present invention is not limited to the embodiments described above, and can be variously modified without departing from the gist thereof. For example, a rotary unit having a single opening in which a plurality of oscillators can be arranged is disposed in the sample chamber. Although the rotary unit may be installed directly in the sample chamber, it is desirable to install the rotary unit in the sample chamber via the oscillator position adjustment mechanism such that the position and orientation of the oscillator can be changed. The rotary unit is rotated for each piece of processing, and an oscillator with no sputtered particles adhering thereto is always disposed near the sample so that the oscillator is exposed from the opening to the sample chamber before processing the sample.

Further, while the ion milling device for milling a plane has been described as an example in the embodiments, the present invention is also applicable to an ion milling device for milling a cross section.

REFERENCE SIGNS LIST

100: ion milling device
101: ion source
102: sample stage
103: sample stage drive source
104: oscillator
105: oscillator position adjustment mechanism 106: trap
107: sample chamber
108: power supply unit
109: beam current detection conductor
110, 211: ammeter
111: oscillation circuit
112: control unit
113: display unit
201: first cathode
202: second cathode
203: anode
204: permanent magnet
205: acceleration electrode
206: gas pipe
207: ion beam irradiation port
251: sample

The invention claimed is:

1. An ion milling device comprising:
a sample chamber;
a sample stage that is disposed in the sample chamber and on which a sample is placed;
an ion source that emits an unfocused ion beam toward the sample;
a control unit that controls an output of the ion beam;
an oscillator that is disposed in the sample chamber; and
an oscillation circuit that oscillates the oscillator and outputs an oscillation signal to the control unit, wherein
the control unit controls the output of the ion beam such that a vibrational frequency change amount of the oscillator per unit time due to deposition of sputtered particles generated by irradiating the sample with the ion beam on the oscillator is kept within a predetermined range.

2. The ion milling device according to claim 1, comprising a trap between the sample stage and the oscillator, wherein
a predetermined voltage from a power supply circuit is applied to the trap, and the predetermined voltage is a voltage at which charged particles of the sputtering particles are trapped.

3. The ion milling device according to claim 1, wherein
the oscillator is attached to the sample chamber via an oscillator position adjustment mechanism, and
a position or an orientation of the oscillator is adjustable by the oscillator position adjustment mechanism.

4. The ion milling device according to claim 1, comprising a rotary unit that includes an opening, and in which a plurality of the oscillators can be disposed, wherein
any one of the plurality of built-in oscillators is disposed to be exposed to the sample chamber from the opening of the rotary unit.

5. The ion milling device according to claim 1, wherein,
when it is determined that the vibrational frequency change amount of the oscillator per unit time is calculated using a vibrational frequency of the oscillator during a time in which at least some of the sputtered particles deposited on the oscillator fall, the control unit does not control the output of the ion beam based on the vibrational frequency change amount.

6. The ion milling device according to claim 1, wherein the ion source is an ion source employing a Penning method, and the control unit controls the output of the ion beam by controlling a discharge voltage of the ion source or a flow rate of argon gas ionized by the ion source.

7. The ion milling device according to claim 1, comprising:
a movable beam current detection conductor; and an ammeter that measures an ion beam current amount of the ion beam with which the beam current detection conductor is irradiated in a state where the beam current detection conductor is disposed on a central axis of the ion beam, wherein
after it is determined that the ion beam current amount of the ion beam measured by the ammeter is stabilized, the control unit moves the beam current detection conductor from the central axis of the ion beam to start irradiating the sample with the ion beam.

8. The ion milling device according to claim 1, wherein the oscillator is a disk-shaped crystal oscillator.

9. An ion milling device comprising:
a sample chamber;
a sample stage that is disposed in the sample chamber and on which a sample is placed;
an ion source that emits an unfocused ion beam toward the sample;
a control unit that controls an output of the ion beam;
an oscillator that is disposed in the sample chamber;
an oscillation circuit that oscillates the oscillator and outputs an oscillation signal to the control unit, wherein
the control unit controls the output of the ion beam such that a vibrational frequency change amount of the oscillator per unit time due to deposition of sputtered particles generated by irradiating the sample with the ion beam on the oscillator is kept within a predetermined range; and
trap between the sample stage and the oscillator, wherein
a predetermined voltage from a power supply circuit is applied to the trap, and the predetermined voltage is a voltage at which charged particles of the sputtering particles are trapped.

10. The ion milling device according to claim 9 wherein
the oscillator is attached to the sample chamber via an oscillator position adjustment mechanism, and
a position or an orientation of the oscillator is adjustable by the oscillator position adjustment mechanism.

11. The ion milling device according to claim 9, comprising a rotary unit that includes an opening, and in which a plurality of the oscillators can be disposed, wherein
any one of the plurality of built-in oscillators is disposed to be exposed to the sample chamber from the opening of the rotary unit.

12. The ion milling device according to claim 9, wherein, when it is determined that the vibrational frequency change amount of the oscillator per unit time is calculated using a vibrational frequency of the oscillator during a time period in which at least some of the sputtered particles deposited on the oscillator fall, the control unit does not control the output of the ion beam based on the vibrational frequency change amount.

13. The ion milling device according to claim 9, wherein the ion source is an ion source employing a Penning method, and the control unit controls the output of the ion beam by controlling a discharge voltage of the ion source or a flow rate of argon gas ionized by the ion source.

14. The ion milling device according to claim 9, comprising:
a movable beam current detection conductor; and
an ammeter that measures an ion beam current amount of the ion beam with which the beam current detection conductor is irradiated in a state where the beam current detection conductor is disposed on a central axis of the ion beam, wherein
after it is determined that the ion beam current amount of the ion beam measured by the ammeter is stabilized, the control unit moves the beam current detection conductor from the central axis of the ion beam to start irradiating the sample with the ion beam.

15. The ion milling device according to claim 9, wherein the oscillator is a disk-shaped crystal oscillator.

\* \* \* \* \*